United States Patent
Ikeda

(10) Patent No.: US 11,404,093 B2
(45) Date of Patent: Aug. 2, 2022

(54) MEMORY SYSTEM AND SENDING SIGNAL ADJUSTMENT METHOD

(71) Applicant: Kioxia Corporation, Tokyo (JP)

(72) Inventor: Shinichi Ikeda, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/200,288

(22) Filed: Mar. 12, 2021

(65) Prior Publication Data

US 2022/0093138 A1 Mar. 24, 2022

(30) Foreign Application Priority Data

Sep. 18, 2020 (JP) .............................. JP2020-157812

(51) Int. Cl.
| | | |
|---|---|---|
| H03B 1/00 | (2006.01) | |
| H03K 3/00 | (2006.01) | |
| G11C 5/14 | (2006.01) | |
| G11C 16/04 | (2006.01) | |
| G11C 7/22 | (2006.01) | |

(52) U.S. Cl.
CPC .............. *G11C 5/145* (2013.01); *G11C 7/222* (2013.01); *G11C 16/0483* (2013.01)

(58) Field of Classification Search
CPC ....... H03K 19/00361; H03K 19/00315; H03K 19/00384; H04L 25/028; H04L 25/0272
USPC .................................................. 327/108, 175
See application file for complete search history.

(56) References Cited

U.S. PATENT DOCUMENTS

| | | | | |
|---|---|---|---|---|
| 7,834,667 | B1* | 11/2010 | Wong ............... | H03K 19/00315 326/26 |
| 8,125,241 | B2 | 2/2012 | Fratti et al. | |
| 8,659,329 | B2 | 2/2014 | Moon et al. | |
| 10,020,059 | B1* | 7/2018 | Balaga .................... | G11C 16/24 |
| 2009/0167368 | A1* | 7/2009 | Chan ................ | H03K 19/01721 327/108 |
| 2011/0148475 | A1* | 6/2011 | Lin ................... | H03K 19/01721 327/109 |
| 2016/0182018 | A1* | 6/2016 | Lukes ..................... | H03K 3/012 327/108 |
| 2019/0140628 | A1* | 5/2019 | Kim ......................... | H03K 5/13 |

FOREIGN PATENT DOCUMENTS

| | | |
|---|---|---|
| JP | 5135477 B2 | 2/2013 |
| JP | 5425705 B2 | 2/2014 |
| JP | 2018-164242 A | 10/2018 |

* cited by examiner

*Primary Examiner* — Quan Tra
(74) *Attorney, Agent, or Firm* — Oblon, McClelland, Maier & Neustadt, L.L.P.

(57) ABSTRACT

A memory system in an embodiment includes; one or more memory chips; and a controller connected to the one or more memory chips, the controller including a first driver configured to send a sending signal to the one or more memory chips, a second driver configured to generate a boost signal that is added to the sending signal, and a control circuit configured to set an addition period for the boost signal based on information relevant to a characteristic of distortion that occurs in the sending signal to the one or more memory chips.

19 Claims, 17 Drawing Sheets

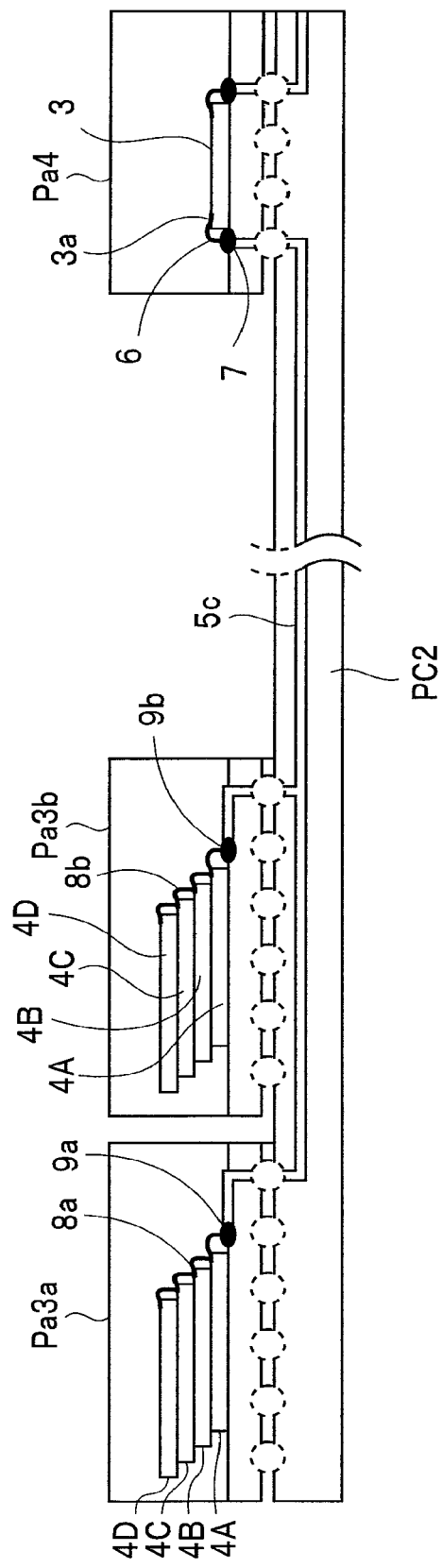

MEMORY SYSTEM AND SENDING SIGNAL ADJUSTMENT METHOD

CROSS-REFERENCE TO RELATED APPLICATION

This application is based upon and claims the benefit of priority from the prior Japanese Patent Application No. 2020-157812 filed in Japan on Sep. 18, 2020, the entire contents of which are incorporated herein by reference.

FIELD

An embodiment of the present invention relates to a memory system and a sending signal adjustment method.

BACKGROUND

In a semiconductor storage device that is a memory device such as a NAND flash memory, the capacity of the memory has been increased in recent years. For example, a multistage stack configuration in which a plurality of NAND memory chips are stacked in a package of a NAND flash memory is implemented in some cases.

In a structure of a plurality of NAND memory chips are stacked and disposed in the package, DQ signal terminals of the respective NAND memory chips are commonly connected in a string manner, and is connected to a controller, in some cases. The controller controls an individual NAND memory chip, using information that identifies the respective NAND memory chip.

In the multistage stack configuration, for a certain NAND memory chip, the other NAND memory chips configure a stub. Thereby, quality of a signal received by the certain NAND memory chip deteriorates in some cases. The signal quality varies depending on a stacked position of the NAND memory chip. Therefore, it is not easy to improve the signal quality in all NAND memory chips of the multistage stack configuration.

Note that the example of the multistage stack configuration has been described but the problem is not limited to the multistage stack configuration. The same phenomenon occurs when for a certain NAND memory chip among a plurality of NAND memory chips that are commonly connected to a controller, the other NAND memory chips configure a stub.

BRIEF DESCRIPTION OF THE DRAWINGS

FIG. 6C is an explanatory diagram schematically showing another example of packaging;

DETAILED DESCRIPTION

A memory system in an embodiment includes one or more memory chips, and a controller connected to the one or more memory chips and including a first driver configured to send a sending signal to the one or more memory chips, a second driver configured to generate a boost signal that is added to the sending signal, and a control circuit configured to set an addition period for the boost signal based on information relevant to a characteristic of distortion that occurs in the sending signal to the one or more memory chips.

Hereinafter, embodiments of the present invention will be described in detail with reference to the drawings.

First Embodiment

The present embodiment adjusts an addition period for a boost signal to be applied to a sending signal for each memory chip, according to a period during which the distortion occurs due to influence of reflection at a transmission path for a transmission signal from a memory controller to the memory chips. Thereby, it is possible to improve signal quality in communication between the memory controller and all memory chips.

Figure 1:
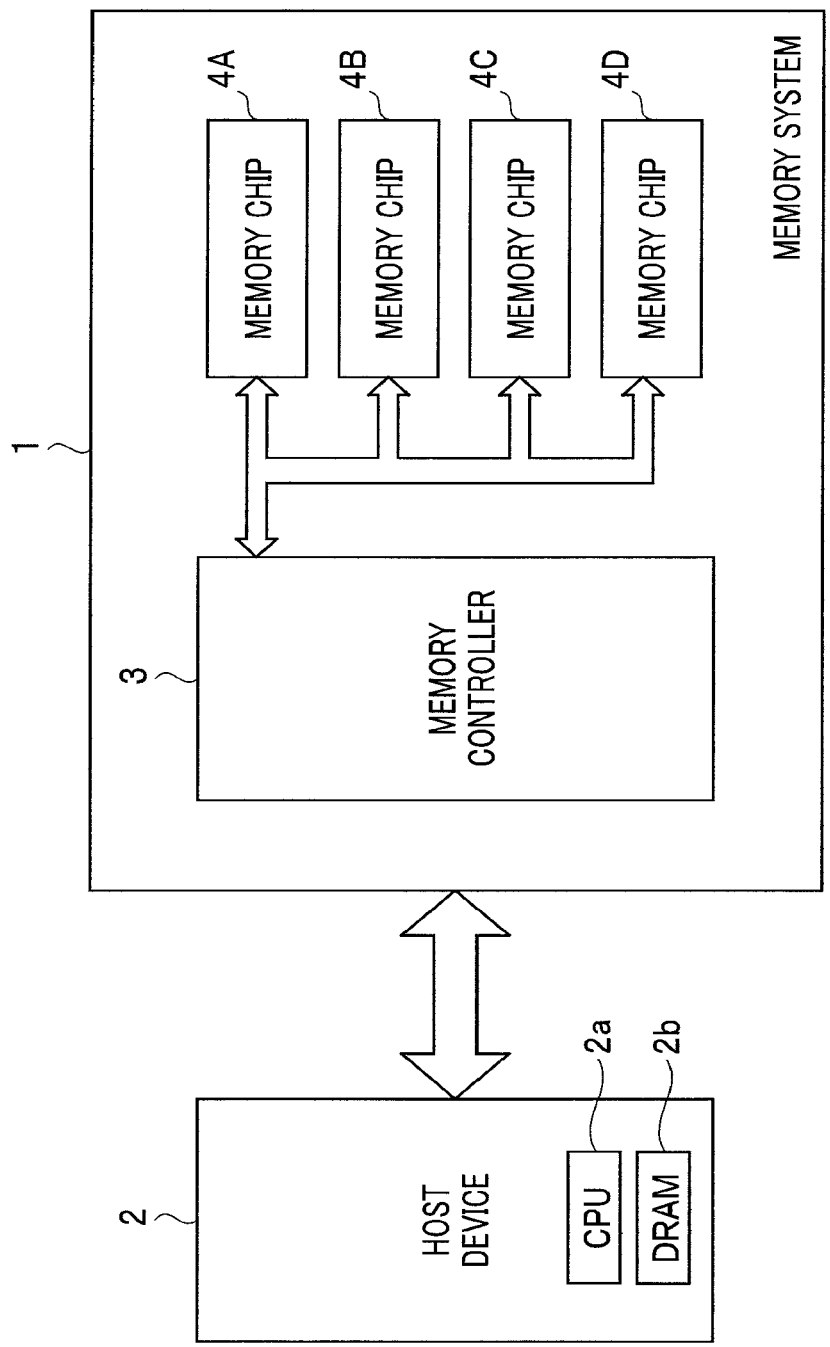
FIG. 1 is a block diagram showing a memory system according to a present embodiment.
Figure 2:
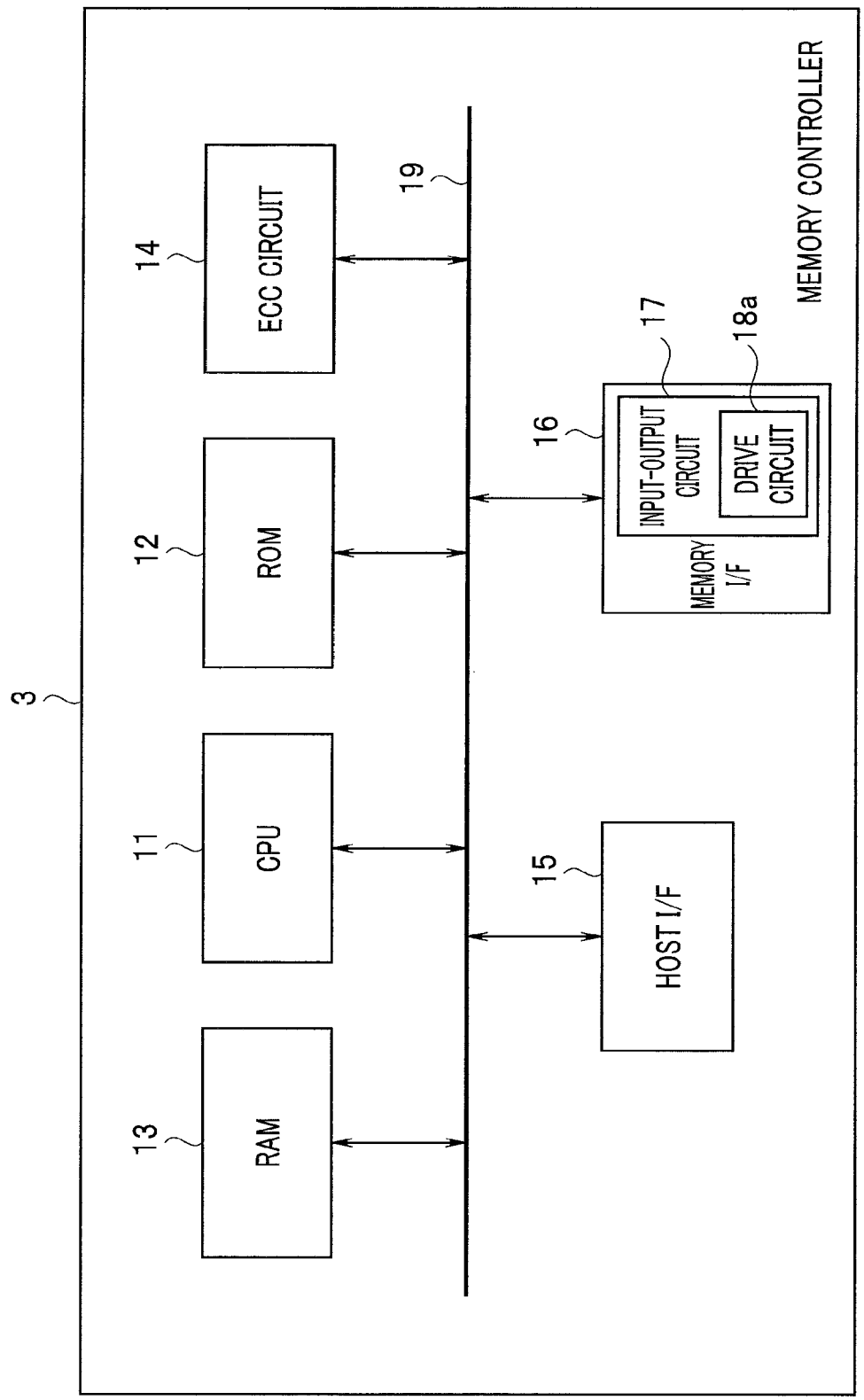
FIG. 2 is a block diagram showing an example of a specific configuration of a memory controller in FIG. 1.

FIG. 1 is a block diagram showing a memory system according to a present embodiment. FIG. 2 is a block diagram showing an example of a specific configuration of a memory controller in FIG. 1.

A memory system 1 in the present embodiment includes a memory controller 3 and four memory chips 4A to 4D. When it is not necessary to make distinction, the four memory chips 4A to 4D are collectively referred to as memory chips 4. Note that the number of memory chips 4 is not limited to four and any number of one or more can be implemented for memory chips.

The memory system 1 can be connected to a host 2. For example, the host 2 is electronic device such as a personal computer, a portable terminal, an in-vehicle device and a server. The host 2 includes a central processing unit (CPU) 2a as a processor, a ROM (not illustrated), and a DRAM 2b. In response to a request from the host 2, the memory system 1 stores user data (referred to as merely data, hereinafter) from the host 2 in the respective memory chips 4, or reads data stored in the respective memory chips 4 and outputs the data to the host 2. More specifically, the memory system 1 can write data in the respective memory chips 4 in response to a writing request from the host 2, and can read data from the respective memory chips 4 in response to a reading request from the host 2.

The memory system 1 may be a UFS (Universal Flash Storage) device or the like in which the memory controller 3 and the plurality of memory chips 4 are configured as one package, or may be an SSD (Solid State Drive) or the like. FIG. 1 shows a state where the memory system 1 is connected to the host 2.

The memory chip 4 is a semiconductor storage device configured by a NAND type flash memory or the like in which data is stored in a non-volatile manner. As shown in FIG. 1, the memory controller 3 and the respective memory chips 4 are connected through a NAND bus. The memory controller 3 controls writing of data to the memory chips 4, in accordance with the writing request from the host 2. Further, the memory controller 3 controls reading of data from the memory chips 4, in accordance with the reading request from the host 2. The memory controller 3 actively controls the writing and reading of data for the memory chip 4 with no request from the host 2, in some cases.

In FIG. 2, the memory controller 3 includes a CPU 11, a ROM 12, a RAM (Random Access Memory) 13, an ECC (Error Check and Correct) circuit 14, a host interface (I/F) 15, and a memory I/F 16. The CPU 11, the ROM 12, the RANI 13, the ECC circuit 14, the host I/F 15 and the memory I/F 16 are connected to each other by an internal bus 19.

The host I/F 15 outputs a request received from the host 2, write data that is the user data, and the like, to the internal bus 19. Further, the host I/F 15 sends the user data read from the memory chips 4, a response from the CPU 11, and the like, to the host 2.

The memory I/F 16 includes an input-output circuit 17. The memory I/F 16 controls a process of writing the user data or the like to the respective memory chips 4 and a process of reading the user data or the like from the respective memory chips 4, based on instructions from the CPU 11. The input-output circuit 17 includes a drive circuit 18a. The drive circuit 18a will be described later in detail.

The CPU 11 integrally controls the memory controller 3. For example, the CPU 11 is a CPU (Central Processing Unit) or an MPU (Micro Processing Unit). When the CPU 11 receives a request from the host 2 via the host I/F 15, the CPU 11 performs a control in accordance with the request. For example, in accordance with the request from the host 2, the CPU 11 instructs the memory I/F 16 to write the user data to the respective memory chips 4. Further, in accordance with the request from the host 2, the CPU 11 instructs the memory I/F 16 to read the user data from the respective memory chips 4.

The CPU 11 decides a storing area (referred to as a memory area, hereinafter) on the respective memory chips 4 for the user data that is stored in the RAM 13. The user data is stored in the RAM 13 via the internal bus 19. The CPU 11 executes the decision on the memory area, for example, for data in a unit of a page that is a writing unit, namely, for page data.

The CPU 11 decides a memory area on the respective memory chips 4 that is a writing destination. To the memory area on the memory chips 4, a physical address is assigned. The CPU 11 manages the memory area that is the writing destination of data, using the physical address. The CPU 11 instructs the memory I/F 16 to write the user data to the memory chips 4 with designating the physical address of the decided memory area. The CPU 11 manages a correspondence between a logical address (a logical address that is managed by the host 2) of the user data and the physical address. When the CPU 11 receives a reading request including the logical address from the host 2, the CPU 11 identifies the physical address corresponding to the logical address, and instructs the memory I/F 16 to read the user data with designating the physical address.

The ECC circuit 14 codes the user data stored in the RAM 13 and generates a code word. Further, the ECC circuit 14 decodes a code word read from the respective memory chips 4.

The RAM 13 temporarily stores the user data received from the host 2 until the user data is stored in the respective memory chips 4, and temporarily stores the data read from the respective memory chips 4 until the data is sent to the host 2. The RAM 13 is a general-purpose memory such as an SRAM (Static Random Access Memory) and a DRAM (Dynamic Random Access Memory).

FIG. 1 shows a configuration example in which the memory controller 3 includes both the ECC circuit 14 and the memory I/F 16. However, the ECC circuit 14 may be incorporated in the memory I/F 16. Further, the ECC circuit 14 may be incorporated in the respective memory chips 4.

When the memory controller 3 receives the writing request and write data from the host 2, the memory controller 3 operates as follows. The CPU 11 temporarily stores the write data in the RAM 13. The CPU 11 reads the data stored in the RAM 13, and inputs the data to the ECC circuit 14. The ECC circuit 14 codes the input data to generate a code word, and supplies the code word to the memory I/F 16. The memory I/F 16 sends the input code word to the respective memory chips 4.

When the memory controller 3 receives the reading request from the host 2, the memory controller 3 operates as follows. The memory I/F 16 supplies a code word read from the respective memory chips 4, to the ECC circuit 14. The ECC circuit 14 decodes the input code word, and stores the decoded data in the RAM 13. The CPU 11 sends the data stored in the RAM 13 to the host 2 through the host I/F 15.

(Package Configuration)

The memory controller 3 and the memory chips 4 that configure the memory system 1 are packaged as a memory device, in some cases.

Figure 3A:
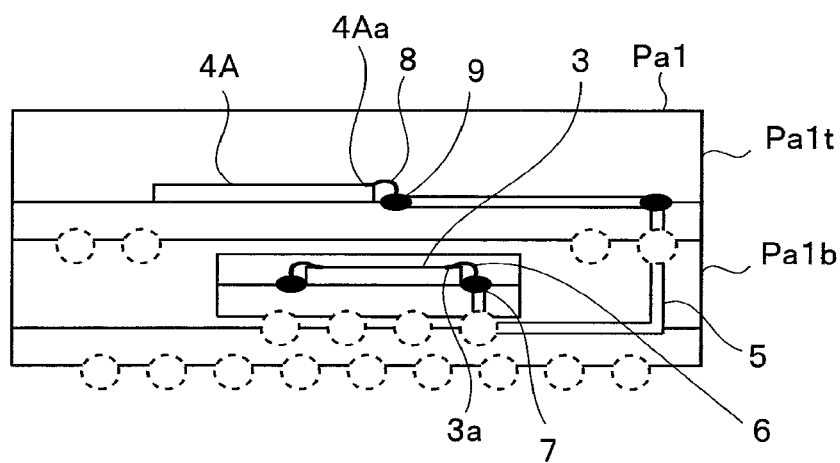
FIG. 3A is an explanatory diagram schematically showing an example of packaging.
Figure 3B:
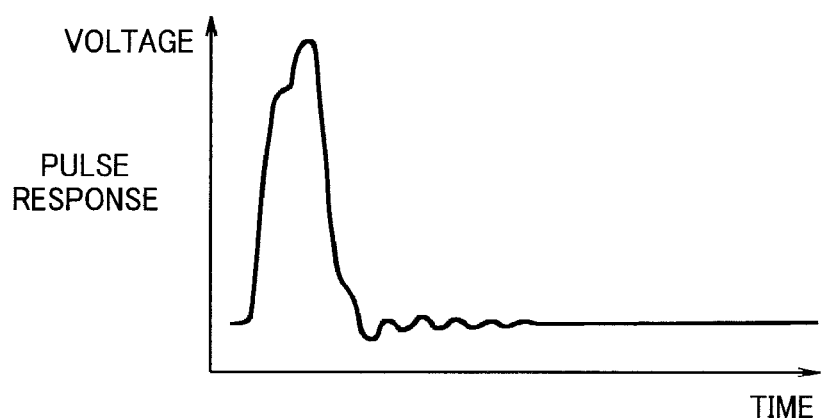
FIG. 3B is a waveform diagram showing a pulse response in the example in FIG. 3A.
Figure 3C:
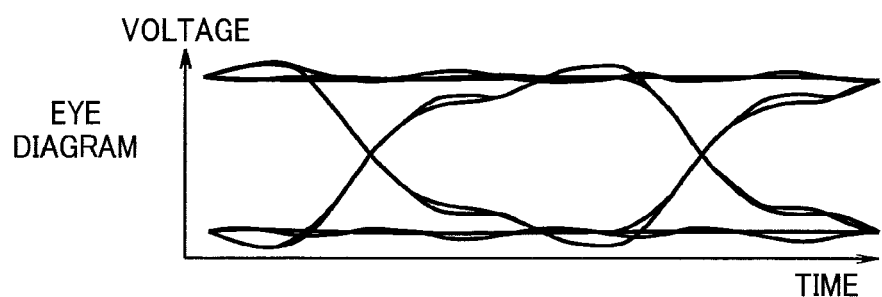
FIG. 3C is an eye diagram in the example in FIG. 3A.
Figure 4A:
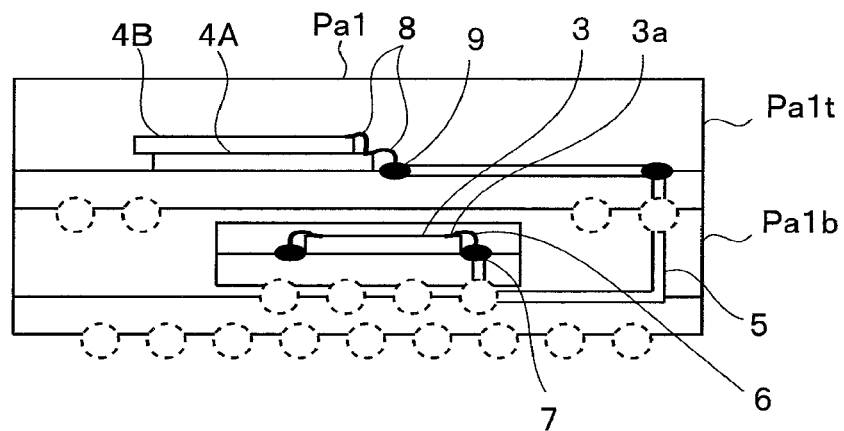
FIG. 4A is an explanatory diagram schematically showing another example of packaging.
Figure 4B:
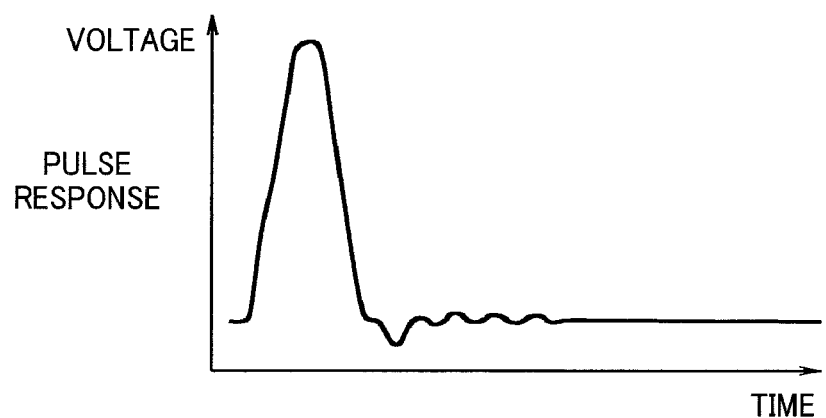
FIG. 4B is a waveform diagram showing a pulse response in the example in FIG. 4A.
Figure 4C:
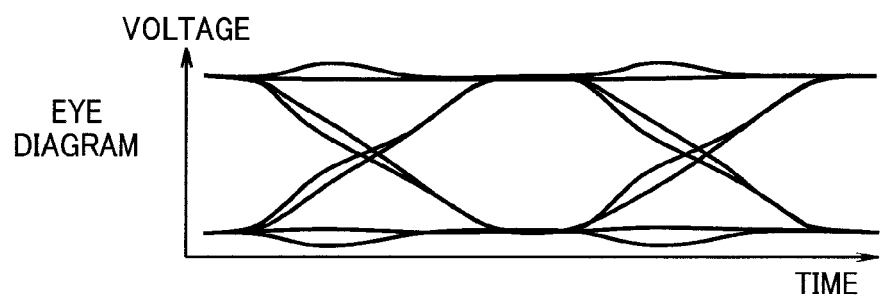
FIG. 4C is an eye diagram in the example in FIG. 4A.

FIG. 3A, FIG. 4A, FIG. 5A and FIGS. 6A to 6C are explanatory diagrams schematically showing examples of a package structure of the memory controller 3 and the memory chips 4. In the figures, identical component elements are denoted by identical reference characters. FIG. 3A to FIG. 5A show examples in which the memory device is configured as a package-on-package (POP). FIG. 3B, FIG. 4B and FIG. 5B are waveform diagrams showing pulse responses in the examples in FIG. 3A, FIG. 4A and FIG. 5A, respectively, and FIG. 3C, FIG. 4C and FIG. 5C show eye diagrams in the examples in FIG. 3A, FIG. 4A and FIG. 5A, respectively.

The memory chips 4 are disposed so as to be stacked in the memory device, in some cases. FIG. 3A shows an example in which the memory chip 4A is not stacked. FIG. 4A shows an example in which the memory chips 4A, 4B are stacked, and FIG. 5A and FIGS. 6A to 6C show examples in which the memory chips 4A to 4D are stacked. Note that broken-line circles in FIG. 3A, FIG. 4A, FIG. 5A and FIGS. 6A to 6C show solder balls that are used for mounting.

In FIG. 3A, the package Pa1 includes a top package Pa1t and a bottom package Pa1b. The memory chip 4A is disposed in the top package Pa1t, and the memory controller 3 made as a chip is disposed in the bottom package Pa1b.

An electrode pad 3a of the memory controller 3 is connected to a mounting terminal 7 through a bonding wire 6, and an electrode pad 4Aa of the memory chip 4A is connected to a mounting terminal 9 through a bonding wire 8. The mounting terminals 7, 9 are mutually connected via a wire 5 that configures the NAND bus.

Figure 5A:
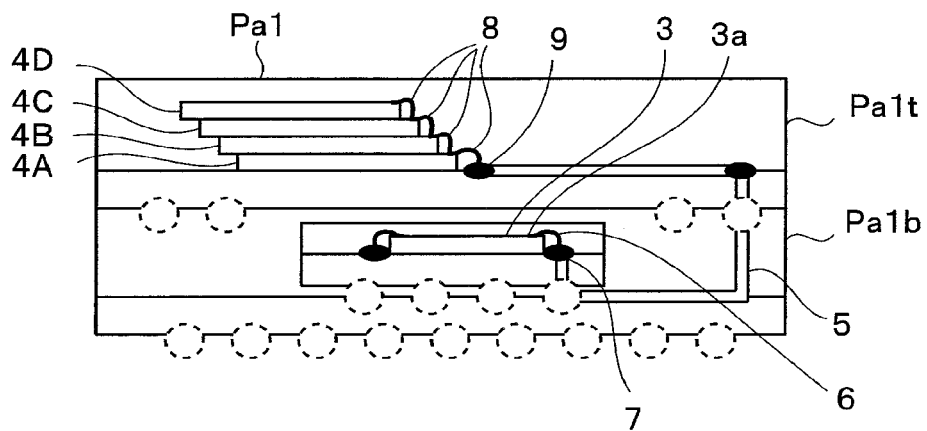
FIG. 5A is an explanatory diagram schematically showing another example of packaging.
Figure 5B:
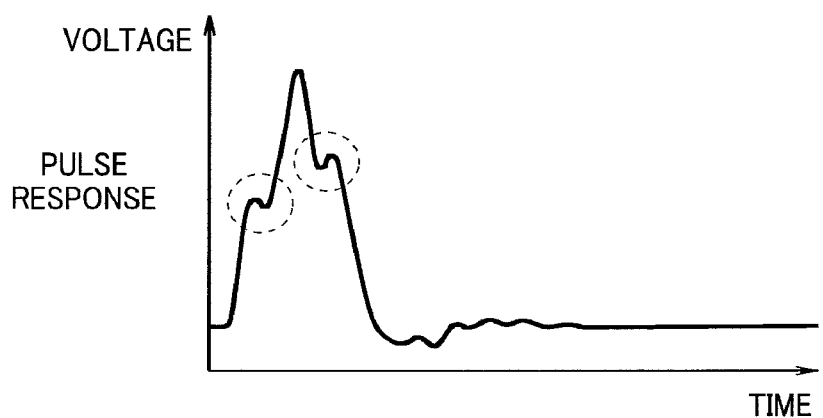
FIG. 5B is a waveform diagram showing a pulse response in the example in FIG. 5A.
Figure 5C:
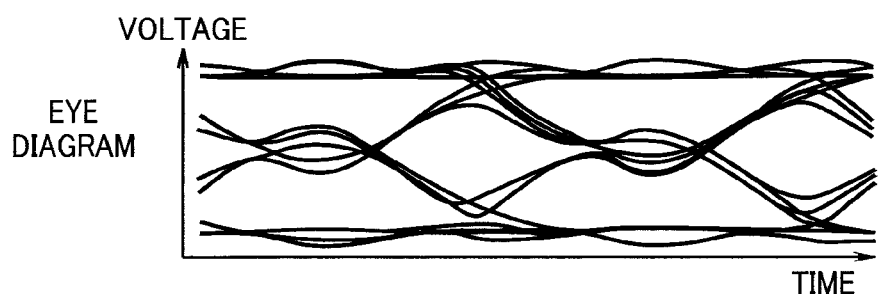
FIG. 5C is an eye diagram in the example in FIG. 5A.

FIG. 4A shows an example in which the memory chips 4A, 4B are stacked in the top package Pa1t, and FIG. 5A shows an example in which the memory chips 4A to 4D are stacked in the top package Pa1t. As shown in FIG. 4A and FIG. 5A, electrode pads (not illustrated) on the respective memory chips 4A to 4D are commonly connected by the bonding wire 8, and are connected to the mounting terminal 9. The memory devices in FIG. 4A and FIG. 5A realize high storage densities and large storage capacities by the plurality of memory chips 4A and 4B or 4A to 4D.

In the plurality of memory chips 4A to 4D, when an upper memory chip 4 and a lower memory chip 4 are connected by the bonding wire 8, the upper memory chip 4 is stacked so as to deviate from the lower memory chip 4. Thereby, the electrode pad provided on the lower memory chip 4 is exposed without being covered by the upper memory chip 4. In this way, the stacked memory chips 4A to 4D are electrically connected to each other by the respective exposed electrode pads and the bonding wire 8.

FIG. 3B, FIG. 4B and FIG. 5B show waveforms (pulse responses) when one pulse signal output by the memory controller 3 is observed at the memory chip 4A in the examples of FIG. 3A, FIG. 4A and FIG. 5A, respectively. FIG. 3C, FIG. 4C and FIG. 5C show eye diagrams when a plurality of pulse signals output by the memory controller 3 are observed at the memory chip 4A in the examples of FIG. 3A, FIG. 4A and FIG. 5A, respectively. Note that in the figures, X-axes indicate time, Y-axes indicate voltage and respective values increase in directions of arrows. As shown in FIG. 3B and FIG. 3C, in the configuration in which only the memory chip 4A as one stage is disposed, the distortion of the pulse response is relatively small, and an eye aperture is sufficiently wide. However, as shown in FIG. 4C, in the configuration in which the memory chips 4A, 4B as two stages are disposed, the eye aperture is smaller than the eye aperture in FIG. 3C. Moreover, as shown in FIG. 5C, in the configuration in which the memory chips 4A to 4D as four stages are disposed, the eye aperture is further smaller than the eye aperture in FIG. 4C.

In this way, when the memory chips 4 have a multistage stack configuration, for a certain memory chip 4, the other memory chips 4 configure a stub, and therefore the waveform is distorted due to the influence of the reflection. As a result, the signal quality deteriorates, and the aye aperture narrows.

Note that the characteristic at the memory chip 4A has been shown in FIG. 3B to FIG. 5B and FIG. 3C to FIG. 5C, but as for the other memory chips 4, the configuration of the stub differs from the configuration of the stub in the case of the memory chip 4A, and therefore the influence of the reflection also differs from the influence of the reflection for the memory chip 4A. In other words, the distortion of the waveform when the plurality of memory chips 4 have a multistage stack configuration differs for each memory chip. In this way, in the memory chips 4 having a multistage stack configuration, a waveform distortion that differs depending on the position is observed. Therefore, as described above, it is not easy to evenly improve a through rate at all memory chips 4.

Figure 6A:
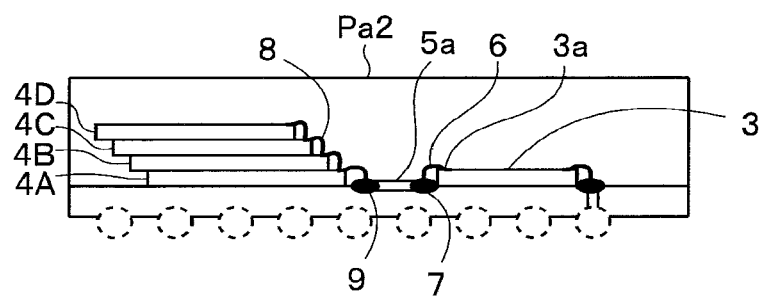
FIG. 6A is an explanatory diagram schematically showing another example of packaging.
Figure 6B:
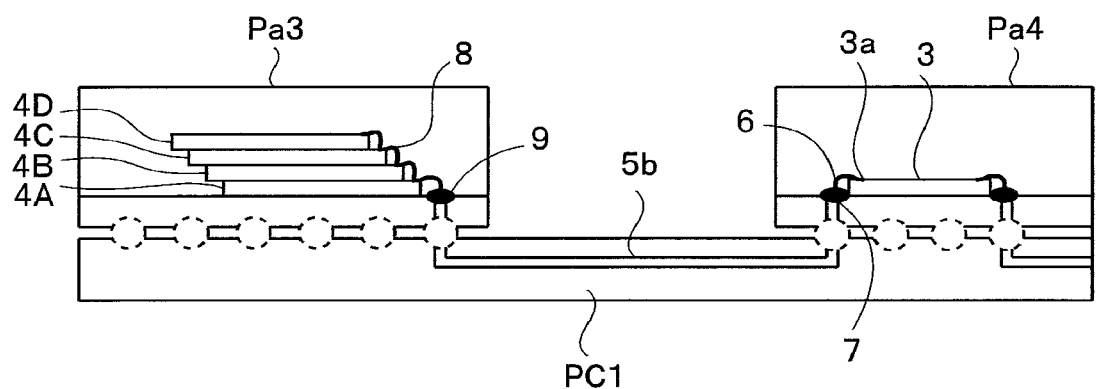
FIG. 6B is an explanatory diagram schematically showing another example of packaging.

Note that the packages of the POP have been described as examples in FIG. 3A to FIG. 5A but the present embodiment can be similarly applied to various other packages. FIG. 6A to FIG. 6C are explanatory diagrams showing configurations of other packages.

FIG. 6A shows a package Pa2 of a UFS device, as an example. In the UFS device, the memory controller 3 and the plurality of memory chips 4A to 4D having a stack configuration are disposed on one interposer. FIG. 6B shows an MCP (Multi Chip Package) package having a point-to-point connection. The plurality of stacked memory chips 4A to 4D are disposed in a memory package Pa3, and the memory controller 3 is disposed in a controller package Pa4. The memory package Pa3 and the controller package Pa4 are mounted on a printed circuit board PC1. FIG. 6C shows a MCP package having a plurality of package connections. The plurality of stacked memory chips 4A to 4D are disposed in each of memory packages Pa3a, Pa3b, and the memory controller 3 is disposed in the controller package Pa4. The memory packages Pa3a, Pa3b and the controller package Pa4 are mounted on a printed circuit board PC2. The respective memory chips 4A to 4D in the package Pa3a are commonly connected by a bonding wire 8a, and are connected to a mounting terminal 9a. The respective memory chips 4A to 4D in the package Pa3b are commonly connected by a bonding wire 8b, and are connected to a mounting terminal 9b.

The mounting terminal 7 and the mounting terminal 9 in FIG. 6A are connected by a wire 5a. The wire 5a is formed on the interposer. The mounting terminal 7 and the mounting terminal 9 in FIG. 6B are connected by a wire 5b. The wire 5b is formed in a wire layer of the printed circuit board PC1. The mounting terminal 7, the mounting terminal 9a and the mounting terminal 9b in FIG. 6C are connected by a wire 5c. The wire 5c is formed in a wire layer of the printed circuit board PC2. The wires 5a to 5c allow data transfer in a high-speed data transfer mode such as Toggle Double Data Rate, between the memory controller 3 and the plurality of stacked memory chips 4A to 4D.

Note that the memory system 1 in the present embodiment is not limited to the package configurations in FIG. 3A, FIG. 4A, FIG. 5A and FIGS. 6A to 6C and can be applied to various package configurations. Particularly, the memory system 1 in the present embodiment is useful in a case where a certain memory chip 4 of a plurality of stacked memory chips 4, the other memory chips 4 configure a stub.

Figure 7:
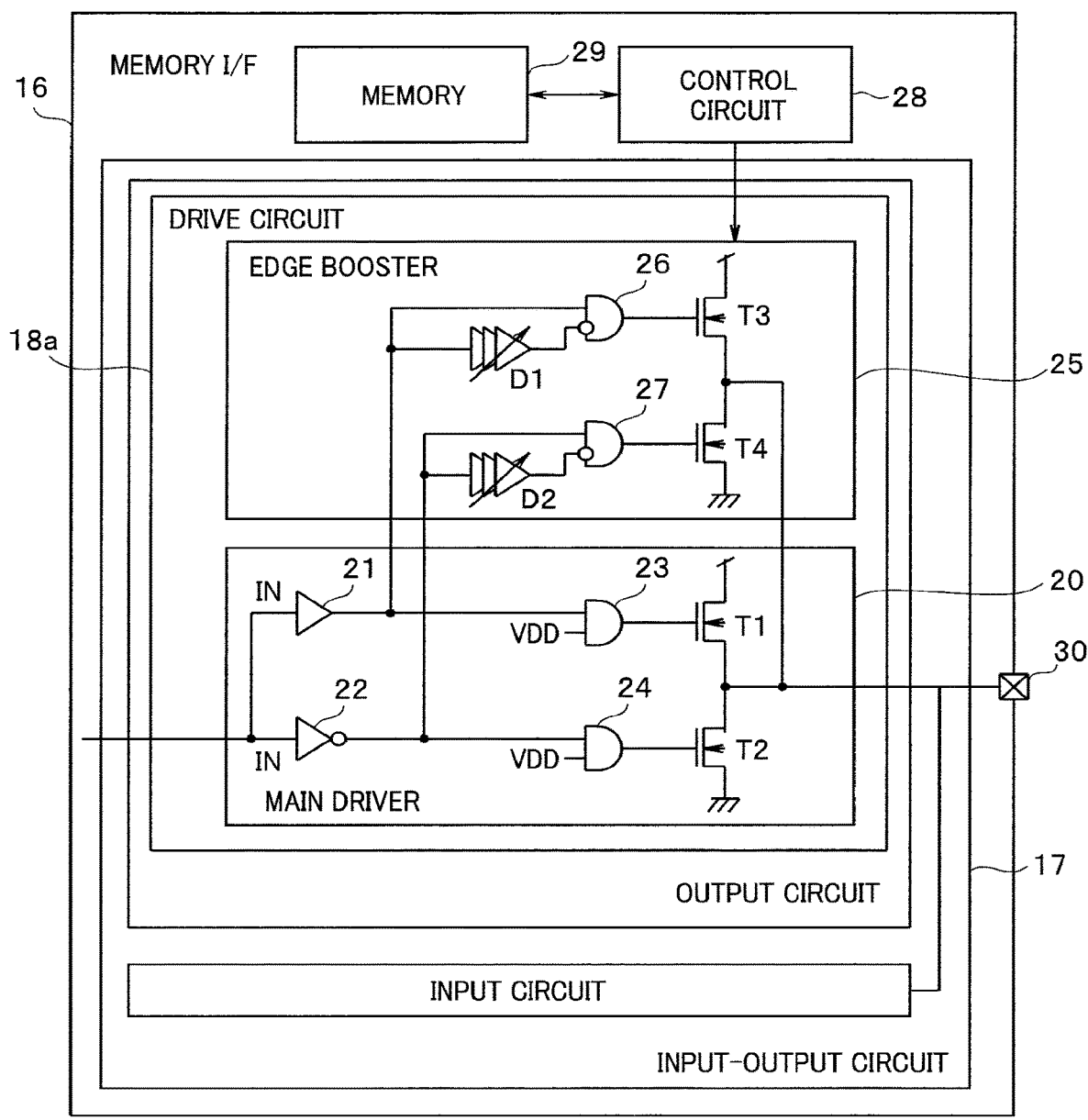
FIG. 7 is a circuit diagram showing an example of a specific configuration of a memory I/F.

FIG. 7 is a circuit diagram showing an example of a specific configuration of the memory I/F 16. The input-output circuit 17 included in the memory I/F 16 is a circuit configured to perform bidirectional communication with the memory chips 4. The input-output circuit 17 includes an input circuit configured to receive data from the memory chips 4 and an output circuit configured to send data to the memory chips 4. The drive circuit 18a is included in the output circuit of the input-output circuit 17. Note that a specific configuration of the input circuit of the input-output circuit 17 is not illustrated in FIG. 7. In the memory I/F 16, a control circuit 28 and a memory 29 are further provided.

The control circuit 28 operates in accordance with a control from the CPU 11. The control circuit 28 may be configured by a processor that uses a CPU, an FPGA (Field Programmable Gate Array) or the like, may control each unit by operating in accordance with programs stored in an unillustrated memory, or may realize some or all of the functions as electronic circuits in hardware. The control circuit 28 controls a delay time of delay circuits D1, D2 described later, using information stored in the memory 29.

Note that the control circuit 28 may control each unit of the drive circuit 18a, may control a whole of the input-output circuit 17, or may control a whole of the memory I/F 16. Alternatively, the CPU 11 of the memory controller 3 may be configured to realize a function of the control circuit 28. As the memory 29, for example, a non-volatile memory is implemented. The memory 29 may be provided at any position in the memory controller 3 instead of the memory I/F 16.

The drive circuit 18a includes a main driver 20 as a first driver circuit and an edge booster 25 as a second driver circuit. The memory I/F 16 generates a sending signal based on the user data to the memory chips 4, in accordance with an instruction from the CPU 11. The sending signal is sent from an input-output terminal 30 of the memory I/F 16 to the memory chips 4 by the main driver 20 of the drive circuit 18a. For example, in the above-described package Pa1 in FIG. 5A, the input-output terminal 30 is connected to the electrode pad 3a of the memory controller 3. The sending signal from the input-output terminal 30 is supplied from the electrode pad 3a to the mounting terminal 7 through the bonding wire 6, and moreover after going through the wire 5, is supplied to the electrode pad of the memory chip 4A through the mounting terminal 9 and the bonding wire 8.

As shown in FIG. 7, the main driver 20 includes a buffer circuit 21, an inverter 22, AND gates 23, 24, and transistors T1, T2. A signal IN input to the main driver 20 is supplied to the buffer circuit 21 and the inverter 22. The buffer circuit 21 buffers the input signal IN, and then supplies the buffered signal to one input terminal of the AND gate 23. The inverter 22 inverts the input signal IN, and then supplies the inverted signal to one input terminal of the AND gate 24. The AND gate 23 calculates a logical product between a level of the signal from the buffer circuit 21 and a level of a voltage VDD, and supplies a calculation result to a gate of the NMOS transistor T1. The AND gate 24 calculates a logical product between a level of the signal from the inverter 22 and the level of the voltage VDD, and supplies a calculation result to a gate of the NMOS transistor T2. A drain of the transistor T1 is connected to a wire having a power source potential. A source of the transistor T1 is connected to the input-output terminal 30 and a drain of the transistor T2. A source of the transistor T2 is connected to a wire having a reference potential.

The voltage VDD indicating a high level (referred to as an H level, hereinafter) is input to each of the respective other input terminals of the AND gates 23, 24, as a control voltage. Therefore, the AND gates 23, 24 output logics of the signals input to the respective one input terminals. Accordingly, when the signal input to the main driver 20 has the H level, the transistor T1 is turned ON, and the transistor T2 is turned OFF. Further, when the signal input to the main driver 20 has a low level (referred to as an L level, hereinafter), the transistor T1 is turned OFF, and the transistor T2 is turned ON. When the transistor T1 is ON and the transistor T2 is OFF, a signal having the H level appears at the input-output terminal 30. When the transistor T1 is OFF and the transistor T2 is ON, a signal having the L level appears at the input-output terminal 30.

As shown in FIG. 7, the edge booster 25 includes AND gates 26, 27, the delay circuits D1, D2, and NMOS transistors T3, T4. The output of the buffer circuit 21 of the main driver 20 is supplied to one input terminal of the AND gate 26 and the delay circuit D1. The output of the inverter 22 of the main driver 20 is supplied to one input terminal of the AND gate 27 and the delay circuit D2. The delay circuits D1, D2 are configured such that delay time can be changed. The delay time is controlled by the control circuit 28. The delay circuit D1 inverts the input signal after delaying, and then supplies the signal to the other input terminal of the AND gate 26. The delay circuit D2 inverts the input signal after delaying, and then supplies the signal to the other input terminal of the AND gate 27.

An output of the AND gate 26 is supplied to a gate of the NMOS transistor T3, and an output of the AND gate 27 is supplied to a gate of the NMOS transistor T4. A drain of the transistor T3 is connected to a wire having the power source potential. A source of the transistor T3 is connected to the input-output terminal 30 and a drain of the transistor T4. A source of the transistor T4 is connected to a wire having reference potential.

Immediately after the output of the buffer circuit 21 transitions from the L level to the H level, each of the levels of the two input terminals of the AND gate 26 is the H level, and the output of the AND gate 26 becomes the H level, so that the transistor T3 is turned ON. Immediately after the transition, the output of the delay circuit D1 has the L level, and the other input terminal of the AND gate 26 still has the H level. However, when the delay time of the delay circuit D1 elapses, the output of the delay circuit D1 transitions from the L level to the H level, and the other input terminal of the AND gate 26 becomes the L level, so that the output of the AND gate 26 transitions from the H level to the L level. When the output of the AND gate 26 becomes the L level, the transistor T3 is turned OFF. In other words, the source of the transistor T3 becomes the H level in accordance with the output of the transistor T1 becoming the H level, and becomes the L level after the elapse of the delay time of the delay circuit D1.

Immediately after the output of the inverter 22 transitions from the L level to the H level, each of the levels of the two input terminals of the AND gate 27 is the H level, and the output of the AND gate 27 becomes the H level, so that transistor T4 is turned ON. Immediately after the transition, the output of the delay circuit D2 has the L level, and the other input terminal of the AND gate 27 still has the H level. However, when the delay time of the delay circuit D2 elapses, the output of the delay circuit D2 transitions from the L level to the H level, and the other input terminal of the AND gate 27 becomes the L level, so that the output of the AND gate 27 transitions from the H level to the L level. When the output of the AND gate 27 becomes the L level, the transistor T4 is turned OFF. In other words, the source of the transistor T4 becomes the H level in accordance with the output of the transistor T2 becoming the H level, and becomes the L level after the elapse of the delay time of the delay circuit D2.

Accordingly, immediately after rising from the L level to the H level when the transistor T1 is turned ON and the transistor T2 is turned OFF, the sending signal that appears at the input-output terminal 30 has a higher H level because the transistor T3 is ON for a predetermined period. Further, immediately after falling from the H level to the L level when the transistor T1 is turned OFF and the transistor T2 is turned ON, the sending signal that appears at the input-output terminal 30 has a lower L level because the transistor T4 is ON for a predetermined period.

Note that a signal that appears at the input-output terminal 30 and that increases or decreases the level of the input-output terminal 30 due to the ON of the transistor T3 or the transistor T4 immediately after the rising of the sending signal or immediately after the falling of the sending signal is referred to as a boost signal, hereinafter.

In the present embodiment, the pre-emphasis function to emphasize the edge of the sending signal with the boost signal is controlled by the control circuit 28. The memory 29 stores stack information indicating a state of the stack of the memory chips 4 included in the memory system 1. As shown in FIG. 5B, the pulse response that deteriorates the through rate has a distortion portion (circle portion) that is nearly flat because inclination becomes gentle once at the time of the rising, and has a distortion portion (circle portion) that is nearly flat because inclination becomes gentle once at the time of the falling. At the distortion portions, a value of a slope of the level (amplitude) of the pulse signal and a polarity can change. Expansion of the eye aperture can be expected by shifting the distortion portions (referred to as intermediate distortion portions, hereinafter) to a higher level at the time of the rising and shifting the distortion portions to a lower level at the time of the falling.

Hence, in the present embodiment, by the boost signal, the edge is emphasized to a higher level immediately after the rising of the level of the signal, and the edge is emphasized to a lower level immediately after the falling of the level of the signal. Thereby, it is possible to expand the eye aperture, namely, to improve the signal quality. However, in the plurality of memory chips 4 having the stack configuration, the state of the production of the distortion at the intermediate distortion portion differs for each memory chip, and it is not possible to evenly enhance the characteristics of all memory chips 4 even when an identical control is performed to the respective memory chips 4.

Hence, in the present embodiment, a period during which the edge is emphasized is changed according to a period (referred to as an intermediate distortion period, hereinafter) during which the intermediate distortion portion occurs, so that the signal qualities of all memory chips 4 are evenly improved. In other words, in the memory 29, information about the intermediate distortion period is stored as the stack information, for each memory chip. Note that the information about the intermediate distortion period may be stored in the memory 29, for example, at the time of factory shipment. Further, at the time of factory shipment, the information about the intermediate distortion period may be stored in a certain area of the memory chips 4, and at the time of actual use, the information about the intermediate distortion period read from the certain area of the memory chips 4 may be stored in the memory 29. The control circuit 28 reads, from the memory 29, the information about the intermediate distortion period corresponding to a memory chip 4 that is a destination, and controls the delay time of the delay circuit D1 and the delay circuit D2, based on the read information.

Figure 8:
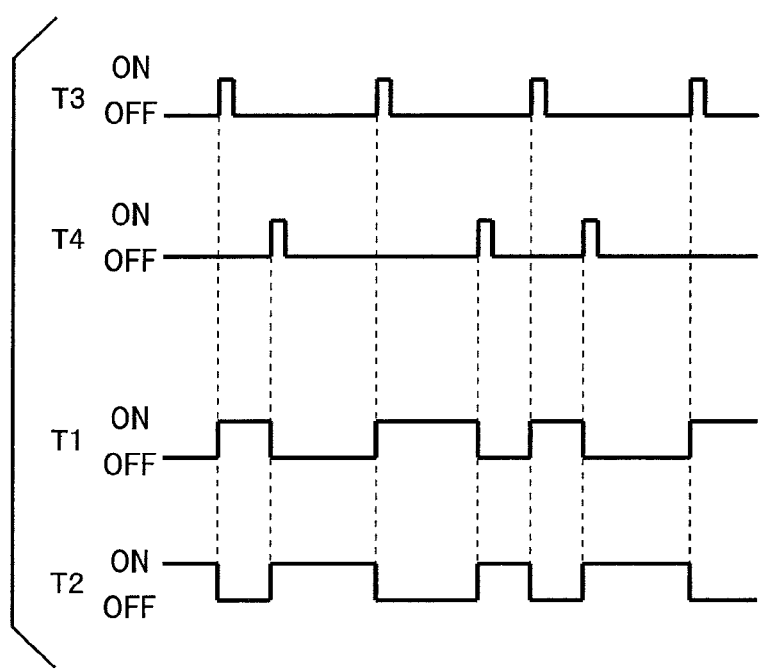
FIG. 8 is a timing chart for explaining an operation of a first embodiment.
Figure 9:
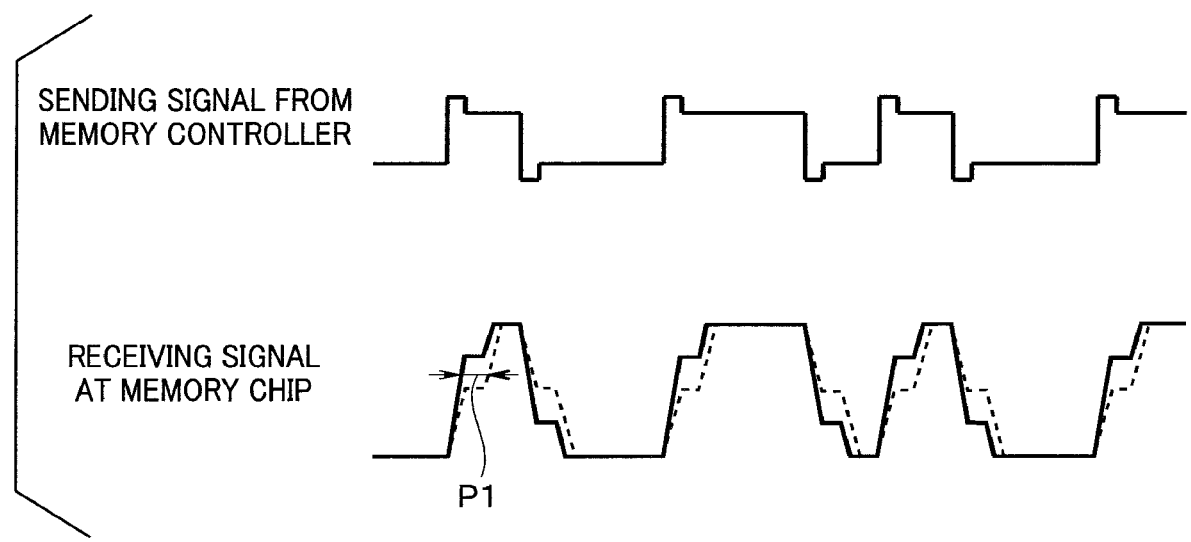
FIG. 9 is a waveform diagram for explaining the operation of the first embodiment.

Next, an operation of the embodiment configured in this way will be described with reference to FIG. 8 and FIG. 9. FIG. 8 is a timing chart for describing the operation of the first embodiment, and FIG. 9 is a waveform diagram for describing the operation of the first embodiment.

The memory I/F 16 supplies, to the main driver 20, an original signal for the sending signal to be sent to the memory chips 4. For example, suppose that the signal is data having the same waveform as an ON-OFF waveform of the transistor T1 in FIG. 8. The signal is supplied to the gate of the transistor T1 through the buffer circuit 21 and the AND gate 23, and is supplied to the gate of the transistor T2 through the inverter 22 and the AND gate 24. Thereby, the ON-OFF of the transistors T1, T2 changes as shown in FIG. 8.

The ON-OFF of the transistors T1, T2 complementarily change. When the transistor T1 is turned ON (the transistor T2 is turned OFF), the input-output terminal 30 becomes the H level, and when the transistor T1 is turned OFF (the transistor T2 is turned ON), the input-output terminal 30 becomes the L level. As a result, if the pre-emphasis function of the edge booster 25 is neglected, the waveform of the sending signal that appears at the input-output terminal 30 becomes the same waveform as the ON-OFF waveform of the transistor T1 in FIG. 8.

The output of the buffer circuit 21 is directly supplied to the one input terminal of the AND gate 26, is inverted after being delayed by the delay circuit D1, and is supplied to the other input terminal of the AND gate 26. The output of the AND gate 26 is supplied to the gate of the transistor T3. As shown in FIG. 8, the transistor T3 is turned ON in synchronization with a timing when the transistor T1 is turned ON, and is turned OFF after the delay time of the delay circuit D1.

The output of the inverter 22 is directly supplied to the one input terminal of the AND gate 27, is inverted after being delayed by the delay circuit D2, and is supplied to the other input terminal of the AND gate 27. The output of the AND gate 27 is supplied to the gate of the transistor T4. As shown in FIG. 8, the transistor T4 is turned ON in synchronization with a timing when the transistor T2 is turned ON, and is turned OFF after the delay time of the delay circuit D2. The boost signal is generated during the ON period (referred to as a boost period, hereinafter) of the transistors T3, T4.

The ON of the transistor T3 (the OFF of the transistor T4) occurs in synchronization with the ON of the transistor T1 (the OFF of the transistor T2), and immediately after the rising of the sending signal that appears at the input-output terminal 30, the sending signal becomes the high H level due to the boost signal. The ON of the transistor T4 (the OFF of the transistor T3) occurs in synchronization with the ON of the transistor T2 (the OFF of the transistor T1), and immediately after the falling of the sending signal that appears at the input-output terminal 30, the sending signal becomes the low L level due to the boost signal.

FIG. 9 shows the sending signal in this case and a receiving signal that is received at a certain memory chip 4. As shown in an upper part of FIG. 9, the sending signal from the input-output terminal 30 is emphasized by the boost signal at the time of the rising and at the time of the falling. In a lower part of FIG. 9, a receiving signal at the memory chip 4 when the boost process is not performed by the edge booster 25 is shown by a thin broken line. In the receiving signal, the intermediate distortion occurs during an intermediate distortion period P1.

In the present embodiment, the control circuit 28 reads information about the intermediate distortion period P1 from the memory 29, and sets the delay time of the delay circuits D1, D2, to a period corresponding to the intermediate distortion period P1. The sending signal is boosted for the delay time, namely for the boost period (addition period). As a result, as shown by a thick line in the lower part of FIG. 9, the receiving signal has a waveform in which the intermediate distortion at the time of the rising is shifted to the H level side and the intermediate distortion at the time of the falling is shifted to the L level side.

Thereby, the eye aperture is expanded, and the signal quality is improved. Note that information about intermediate distortion period relevant to the respective memory chips 4 is stored in the memory 29, and the control circuit 28 reads the information corresponding to a memory chip 4 that is a destination, and decides the delay time of the delay circuits D1, D2. Thereby, it is possible to improve the signal quality at the time of the sending to each memory chip 4.

In this way, in the present embodiment, the boost period (addition period) for the boost signal that is added at the rising and falling of the sending signal is set using the information about the intermediate distortion period for each memory chip, and the signal quality can be improved according to the characteristic at the position of each memory chip.

Second Embodiment

Figure 10:
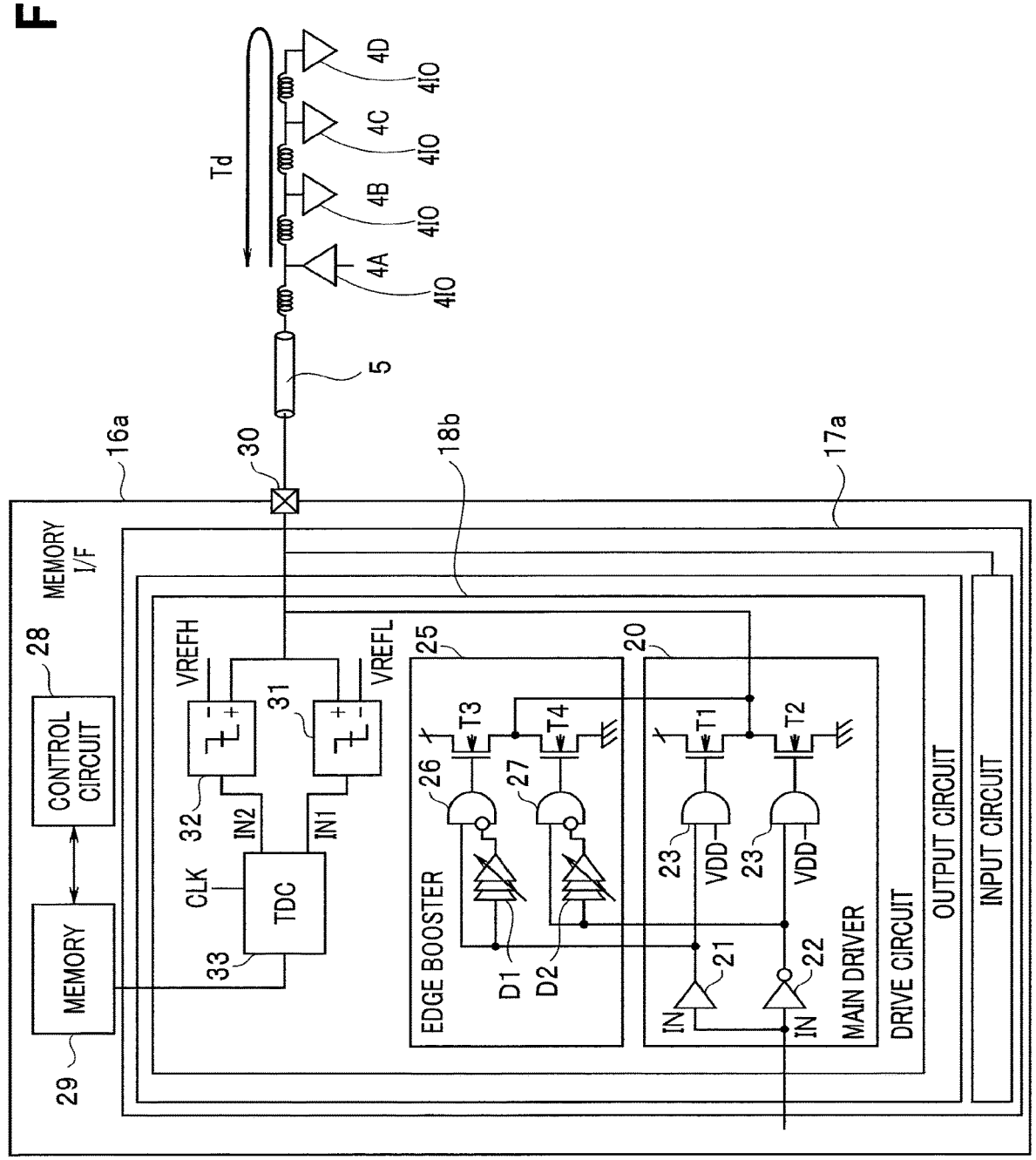
FIG. 10 is a circuit diagram for explaining a second embodiment.

FIG. 10 is a circuit diagram showing a second embodiment. In FIG. 10, component elements identical to component elements in FIG. 7 are denoted by identical reference characters and the description of the component elements will be omitted. In the present embodiment, a memory I/F 16a including a drive circuit 18b instead of the drive circuit 18a in the first embodiment is implemented, and the other configuration is the same as the configuration of the first embodiment. In the first embodiment, it is described that the information about the intermediate distortion period is previously stored in the memory 29. In the present embodiment, the information about the intermediate distortion period can be evaluated by the memory controller 3.

For example, it is thought that the same distortion occurs in data that is sent, between when data is sent from the memory controller 3 to the memory chip 4A and when data is sent from the memory chip 4A to the memory controller 3. Hence, in the present embodiment, by receiving the data sent from the memory chip 4 at the input-output circuit 17, the intermediate distortion that occurs in the sending data from the input-output circuit 17 is estimated, so that the information about the intermediate distortion period is acquired.

FIG. 10 is a circuit diagram showing an example of a specific configuration of the memory I/F 16a. An input-output circuit 17a included in the memory I/F 16a is a circuit configured to perform bidirectional communication with the memory chips 4. The input-output circuit 17a includes an input circuit configured to receive data from the memory chips 4 and an output circuit configured to send data to the memory chips 4. The drive circuit 18b is included in the output circuit of the input-output circuit 17a. Note that a specific configuration of the input circuit of the input-output circuit 17a is not illustrated in FIG. 10. In the memory I/F 16a, the control circuit 28 and the memory 29 are further provided.

The drive circuit 18b includes comparator circuits 31, 32 and a TDC (time to digital converter) 33, in addition to the main driver 20 and the edge booster 25. The configurations of the main driver 20 and the edge booster 25 are the same as the configurations in the first embodiment. Note that the comparator circuits 31, 32 and the TDC 33 may be provided in the input circuit within the input-output circuit 17a of the memory I/F 16a.

Each of the memory chips 4A to 4D includes an input-output circuit 410 configured to exchange signals with the memory I/F 16a of the memory controller 3. In the example of the package Pa1 in FIG. 5A, the input-output terminal 30 of the memory I/F 16a and the memory chips 4A to 4D are electrically connected through the electrode pad 3a provided on the memory controller 3, the bonding wire 6, the mounting terminal 7, the wire 5, the mounting terminal 9, the bonding wire 8 and the electrode pads on the memory chips 4. Intervals between the respective input-output circuits 410 of the memory chips 4 shown in FIG. 10 and the input-output terminal 30 of the memory I/F 16a can be expressed as a distributed constant line, and is shown by the wire 5 and coils in FIG. 10. The example in FIG. 10 shows that only the input-output circuit 410 of the memory chip 4A of the respective input-output circuits 410 is in a state of outputting data, but each memory chip 4 can receive and output data.

The output of each of the memory chips 4 having the stack configuration is transmitted to the memory I/F 16a through the wire 5 and the input-output terminal 30, and in addition, is transmitted from the bonding wire 8 (see FIG. 5A) to the memory I/F 16a through the wire 5 and the input-output terminal 30 after being transmitted to the memory chip 4 (referred to as the memory chip 4 at a distal end, hereinafter) side at the farthest position from the memory controller 3 via the bonding wire 8 and being reflected. It is thought that the intermediate distortion occurs in the data that is transmitted, as a result of occurrence of the reflection. In other words, it is thought that the intermediate distortion period depends on a difference in signal transfer path between a direct wave and a reflected wave, and the intermediate distortion period has a value that differs for each memory chip 4 depending on the position of each memory chip 4.

In the present embodiment, the comparator circuits 31, 32 and the TDC 33 configure a circuit (referred to as a measurement circuit, hereinafter) that measures influence of the reflection, and detect a period during which the signal waveform is nearly flat due to the intermediate distortion that occurs by the reflection, as the intermediate distortion period, based on the sending signal from each memory chip 4.

In the comparator circuits 31, 32, the signal that appears at the input-output terminal 30 is input to respective positive input terminals. A reference voltage VREFL is applied to a negative input terminal of the comparator circuit 31, and a reference voltage VREFH is applied to a negative input terminal of the comparator circuit 32. Note that the reference voltages VREFL, VREFH as reference levels are based on a potential (referred to as an intermediate potential, hereinafter) of a flat portion due to the intermediate distortion of the sending signal, and can be calculated from parameters such as an impedance of the drive circuit 18b and a line length of the wire 5. The reference voltage VREFL is set to a potential between the intermediate potential and GND, and the reference voltage VREFH is set to a potential between the intermediate potential and VDD.

The comparator circuit 31 compares the voltages applied to the positive input terminal and the negative input terminal, based on a clock CLK, and outputs a comparison result IN1 to the TDC 33. The comparator circuit 32 compares the voltages applied to the positive input terminal and the negative input terminal, based on the clock CLK, and outputs a comparison result IN2 to the TDC 33. The TDC 33 detects a time difference in edge timing between the input comparison results IN1, IN2, and outputs a detection result as a TDC output. The TDC output from the TDC 33 is stored in the memory 29 as the information about the intermediate distortion period.

Figure 11:
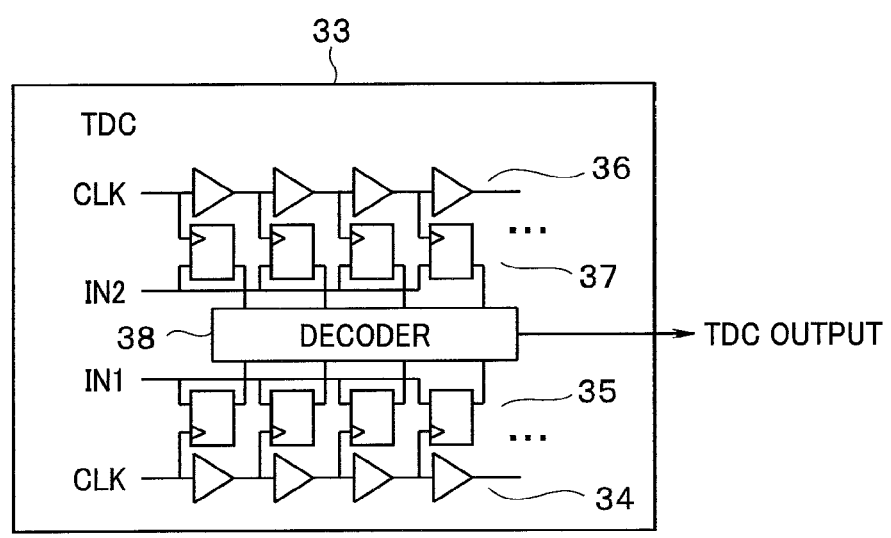
FIG. 11 is a circuit diagram showing an example of a specific configuration of a TDC.

FIG. 11 is a circuit diagram showing an example of a specific configuration of the TDC 33. The TDC 33 as a period detection circuit is configured by multistage delay elements 34, 36, multistage latches 35, 37 and a decoder 38. The clock CLK is supplied to the TDC 33, and the clock CLK is sequentially transferred to the respective stages of the respective delay elements 34, 36. Each latch 35 takes in the comparison result IN1 at a timing when the clock CLK is transferred, and outputs the comparison result IN1 to the decoder 38. Thereby, the decoder 38 acquires the number of delay stages at the edge timing in the comparison result IN1. Each latch 37 takes in the comparison result IN2 at a timing when the clock CLK is transferred, and outputs the comparison result IN2 to the decoder 38. Thereby, the decoder 38 acquires the number of delay stages at the edge timing in the comparison result IN2.

The decoder 38 detects a gap in time between the edge timing in the comparison result IN1 and the edge timing in the comparison result IN2, at an accuracy of delay times of the delay elements 34, 36, and outputs a digital value of a detection result as the TDC output.

Figure 12:
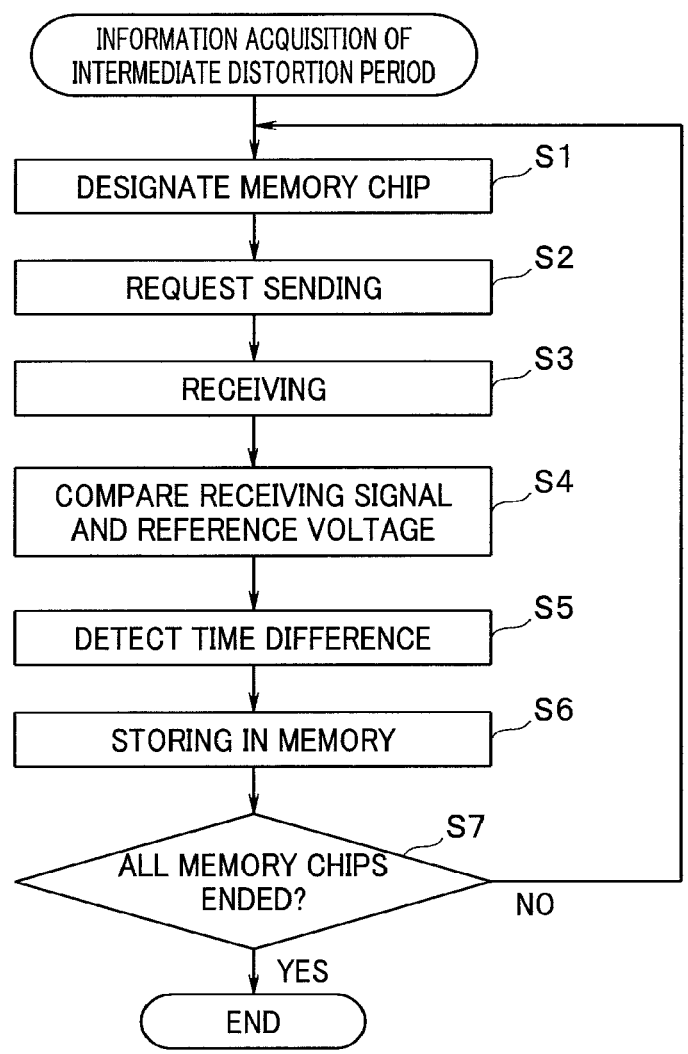
FIG. 12 is a flowchart for explaining an operation of a second embodiment.

Next, an operation of the embodiment configured in this way will be described with reference to FIG. 12 and FIG. 13. FIG. 12 is a flowchart for describing the operation of the second embodiment, and FIG. 13 is a timing chart for describing the operation of the second embodiment.

The control circuit 28 designates a certain memory chip 4 of the memory chips 4 in S1 of FIG. 12, and generates a command for causing the certain memory chip 4 to output the sending signal (S2). The command is supplied from the input-output terminal 30 of the memory I/F 16a to the memory chip 4 via the wire 5. For example, suppose that a command to the memory chip 4A is generated. The memory chip 4A receives the command, and then sends the sending signal (for example, a step pulse) from the input-output circuit 410. The sending signal is directly received at the drive circuit 18b of the memory I/F 16a via the wire 5, and is received at the drive circuit 18b of the memory I/F 16a via the wire 5 after being reflected by the memory chip 4 (the memory chip 4 at the distal end) (the memory chip 4D in FIG. 10) at the farthest position from the memory controller 3 (S3). The signal received through the input-output terminal 30 is supplied to the comparator circuits 31, 32. The comparator circuit 31 compares the receiving signal and the reference voltage VREFL, and the comparator circuit 32 compares the receiving signal and the reference voltage VREFH (S4).

Figure 13:
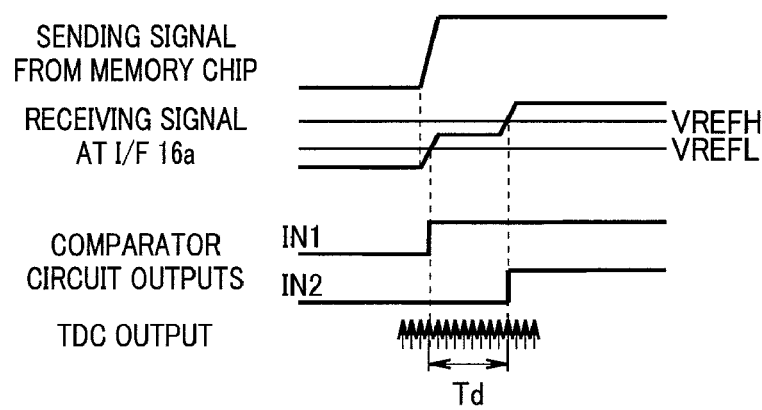
FIG. 13 is a timing chart for explaining the operation of the second embodiment.

FIG. 13 shows a vicinity of the rising timing of the step pulse that is sent from the memory chip 4. As shown in FIG. 13, the receiving signal input to the input-output terminal 30 of the memory I/F 16a rises at a certain inclination in synchronization with the rising of the step pulse, due to the influence of the direct wave from the memory chip 4A, becomes nearly flat once due to the influence of the reflected wave, and thereafter, rises at a certain inclination again.

The comparator circuit 31 outputs the comparison result IN1 showing, as an edge, the first timing after the rising of the receiving signal, by comparing the receiving signal and the reference voltage VREFL. The comparator circuit 32 outputs the comparison result IN2 showing, as an edge, the second timing after the rising of the receiving signal, by comparing the receiving signal and the reference voltage VREFH. In other words, a time difference Td between the edges in the comparison results IN1, IN2 corresponds to the period during which the inclination of the receiving signal is nearly flat, namely, the intermediate distortion period.

As shown in FIG. 13, the TDC 33 evaluates the time difference Td between the timing of the rising edge in the comparison result IN1 and the timing of the rising edge in the comparison result IN2 (S5). The TDC 33 outputs the digital value of the evaluated time difference Td to the memory 29. In this way, the information about the time difference Td is stored in the memory 29, as the information about the intermediate distortion period evaluated for the memory chip 4A (S6).

In S7 that is a next step, the control circuit 28 determines whether the information about the intermediate distortion period has been evaluated for all memory chips 4. When the intermediate distortion period has not been evaluated for all memory chips 4, the control circuit 28 returns the process to S1, and designates a next memory. Thereafter, the same operation is repeated in S1 to S7. When the information about the intermediate distortion period has been evaluated and has been stored in the memory 29 for all memory chips 4 in this way, the process ends.

The operation to send the sending data from the memory I/F 16a after the completion of the process is the same as the operation in the first embodiment.

In this way, the present embodiment detects the intermediate distortion period by receiving the sending signal from each memory chip 4 and comparing the receiving signal and the reference voltage. Thereby, it is not necessary to evaluate the information about the intermediate distortion period at the time of factory shipment. Further, even when aged deterioration or the like occurs in an actual line or the like, it is possible to properly measure the intermediate distortion period.

Third Embodiment

Figure 14:
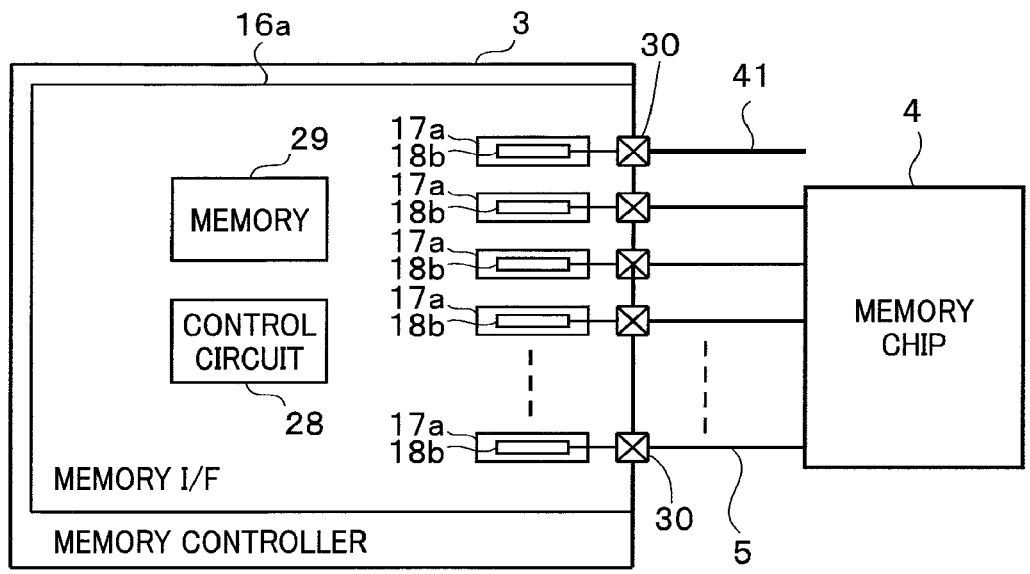
FIG. 14 is a diagram for explaining a third embodiment.

FIG. 14 is an explanatory diagram showing a third embodiment. In FIG. 14, component elements identical to component elements in FIG. 1 and FIG. 10 are denoted by identical reference characters and the description of the component elements will be omitted. The second embodiment has shown the example in which the intermediate distortion period is evaluated based on the signal sent from the memory chip 4. The present embodiment shows an example in which the intermediate distortion period is evaluated based on a signal sent from the memory controller 3.

Generally, a plurality of wires are provided between the memory I/F 16a and the memory chip 4, and respective input-output terminals 30 are connected to the respective wires. FIG. 14 shows that the memory I/F 16a and the memory chip 4 are connected by the plurality of wires 5. Drive circuits 18b respectively included in input-output circuits 17a in the memory I/F 16a are connected to the respective input-output terminals 30. In FIG. 14, only the plurality of drive circuits 18b respectively connected to the respective input-output terminals 30, the control circuit 28 and the memory 29 are shown in the memory I/F 16a. Note that the present embodiment can implement the drive circuit 18b having a configuration identical to the configuration in FIG. 10.

In the present embodiment, in addition to the wire 5, a redundant wire 41 is connected to each input-output terminal 30. The redundant wire 41 is a wire that is provided in parallel to the wire 5 in order to measure the influence of the reflection and that is not connected to the memory chip 4. In other words, the redundant wire 41 is extended to the position of a mounting terminal (the mounting terminal 9 at a vicinity of the memory chip 4A in FIG. 5) connected to the electrode pad of the memory chip 4 (referred to as the memory chip 4 at a close end, hereinafter) closest to the memory controller 3, similarly to the wire 5, but is not electrically connected to the memory chip 4. In the example of the package Pa1 in FIG. 5A, one end of the redundant wire 41 is connected to the electrode pad 3a provided on the memory controller 3 through the mounting terminal 7 and the bonding wire 6. On the other hand, the other end of the redundant wire 41 is extended to the position of the mounting terminal 9 at the vicinity of the memory chip 4A, but the bonding wire 8 is not connected to the redundant wire 41, at any electrode pad on the memory chip 4A.

In the present embodiment, the intermediate distortion period is evaluated using the sending signal of the drive circuit 18b corresponding to the redundant wire 41 and the sending signal of the drive circuit 18b corresponding to the wire 5.

Figure 15:
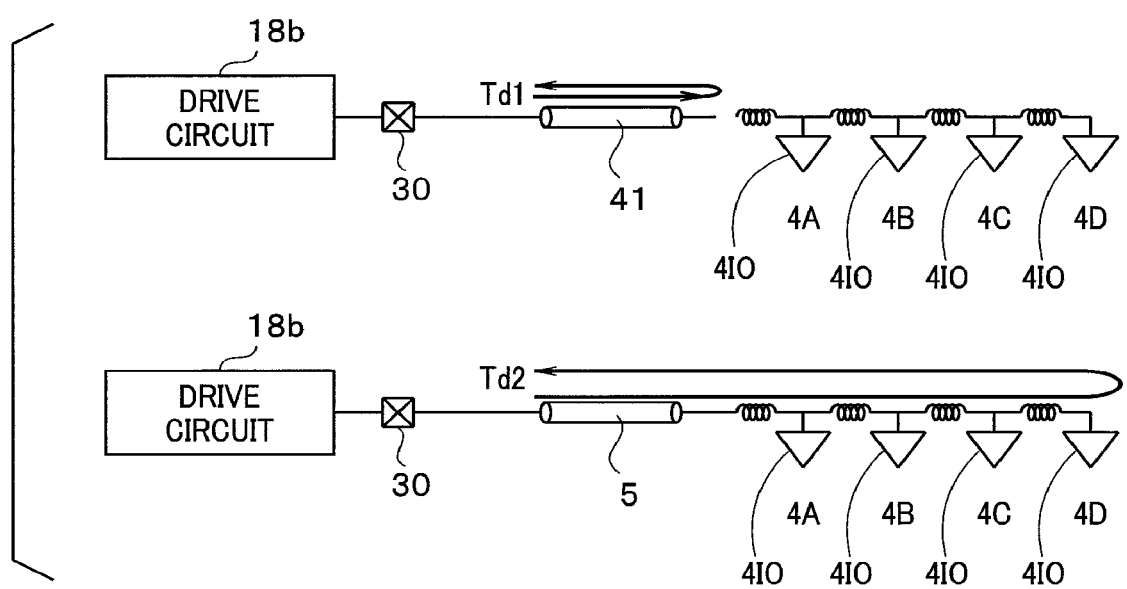
FIG. 15 is a diagram for explaining an operation of the third embodiment.
Figure 17:
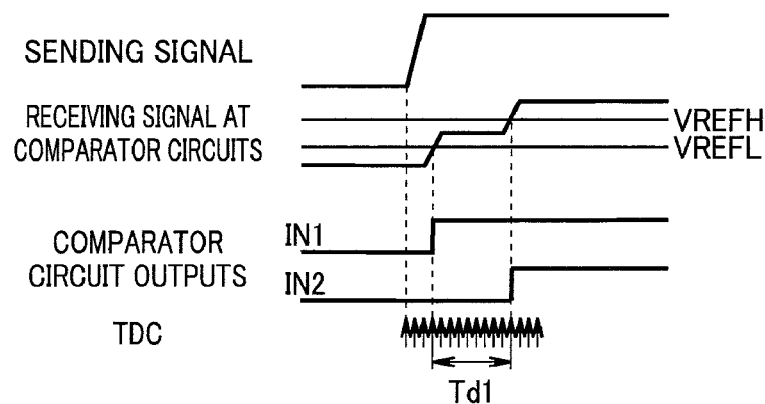
FIG. 17 is a timing chart for explaining a part of the operation of the third embodiment.
Figure 18:
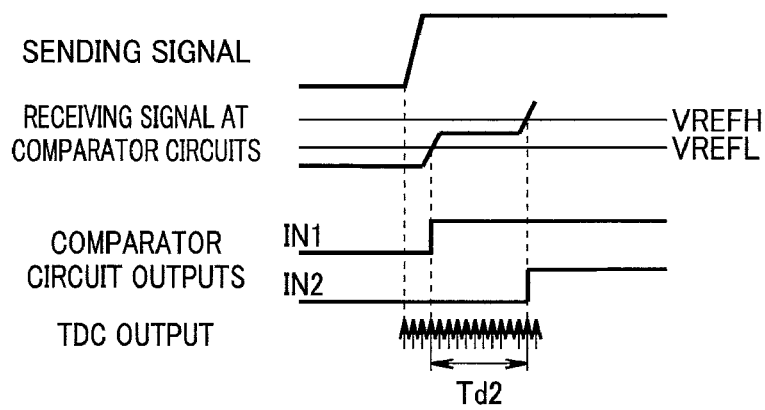
FIG. 18 is a timing chart for explaining another part of the operation of the third embodiment.

Next, an operation of the embodiment configured in this way will be described with reference to FIG. 15 and FIG. 16. FIG. 15 is an explanatory diagram for describing the operation of the third embodiment, FIG. 16 is a flowchart for describing the operation of the third embodiment, and FIG. 17 and FIG. 18 are timing charts for describing the operation of the third embodiment.

The redundant wire 41 is extended to the position of the vicinity of the mounting terminal connected to the memory chip 4 at the close end of the plurality of memory chips 4, but is not connected to the memory chip 4. Accordingly, the sending signal from the main driver 20 of the drive circuit 18b connected to the redundant wire 41 through the input-output terminal 30 is directly input to the comparator circuits 31, 32 that configure the measurement circuit, and as shown in an upper part of FIG. 15, the sending signal is reflected at the termination (the other end) of the redundant wire 41 and is input to the comparator circuits 31, 32.

The sending signal from the main driver 20 of the drive circuit 18b connected to the wire 5 through the input-output terminal 30 is reflected at a far end of a transmission line 41 as shown in a lower part of FIG. 15. The waveform of the signal reflected at the far end of the transmission line 41 is input to the comparator circuits 31, 32.

Figure 16:
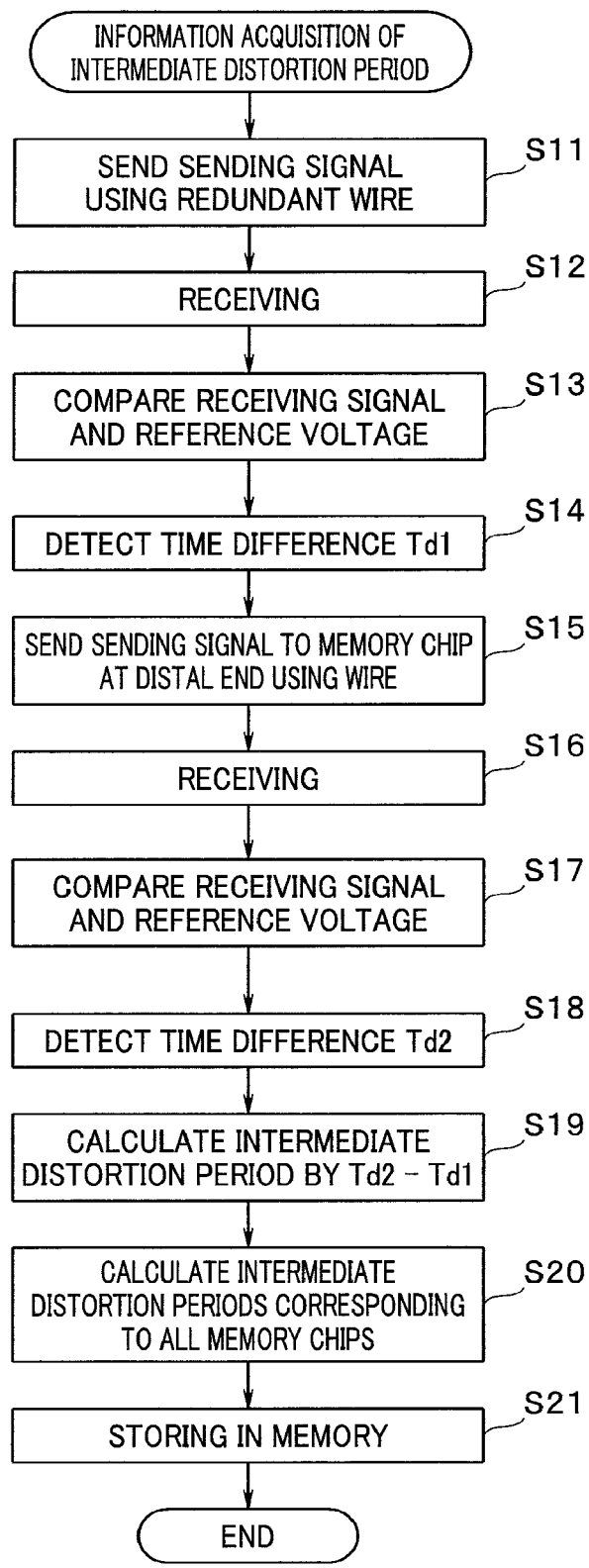
FIG. 16 is a flowchart for explaining the operation of the third embodiment.

In S11 of FIG. 16, the control circuit 28 supplies the sending signal such as a step pulse, to the drive circuit 18b connected to the redundant wire 41, and causes the drive circuit 18b to send the sending signal from the input-output terminal 30. Note that a clock synchronized with the step pulse is applied as the clock CLK of the TDC 33.

The sending signal from the drive circuit 18b is directly received at the comparator circuits 31, 32. Further, the sending signal is supplied from the input-output terminal 30 to the redundant wire 41, is reflected at the termination (the other end) of the redundant wire 41, and thereafter, is received at the comparator circuits 31, 32 through the input-output terminal 30 (S12). The comparator circuit 31 compares the receiving signal and the reference voltage VREFL, and the comparator circuit 32 compares the receiving signal and the reference voltage VREFH (S13).

FIG. 17 shows a vicinity of the rising timing of the sending signal (step pulse) that is sent from the drive circuit 18b in this case. As shown in FIG. 17, the receiving signal input to the input-output terminal 30 of the memory I/F 16a rises at a certain inclination in synchronization with the rising of the step pulse, due to the influence of the direct wave from the drive circuit 18b, becomes nearly flat once due to the influence of the reflected wave having passed through the redundant wire 41, and thereafter, rises at a certain inclination again.

The comparator circuit 31 outputs the comparison result IN1 showing, as an edge, the first timing after the rising of the receiving signal, by comparing the receiving signal and the reference voltage VREFL. The comparator circuit 32 outputs the comparison result IN2 showing, as an edge, the second timing after the rising of the receiving signal, by comparing the receiving signal and the reference voltage VREFH. A time difference Td1 between the edges in the comparison results IN1, IN2 corresponds to the period during which the inclination of the receiving signal is nearly flat, namely, the intermediate distortion period due to the reflection of the redundant wire 41.

As shown in FIG. 17, the TDC 33 evaluates the time difference Td1 between the timing of the rising edge in the comparison result IN1 and the timing of the rising edge in the comparison result IN2, by counting the delay time while sequentially delaying the input clock CLK (S14). The TDC 33 outputs and stores the digital value of the evaluated time difference Td1, in the memory 29.

Next, in S15, the control circuit 28 supplies the sending signal such as a step pulse, to the drive circuit 18b connected to the wire 5, and causes the drive circuit 18b to send the sending signal from the input-output terminal 30. Note that a clock synchronized with the step pulse is used as the clock CLK of the TDC 33. In this case, for example, the control circuit 28 designates the memory chip 4 at the distal end, as the destination of the sending signal.

The sending signal from the drive circuit 18b is directly received at the comparator circuits 31, 32. Further, the sending signal is supplied from the input-output terminal 30 to the wire 5, is reflected at the memory chip 4 at the distal end, and thereafter, is received at the comparator circuits 31, 32 through the input-output terminal 30 via the wire 5 (S16). The comparator circuit 31 compares the receiving signal and the reference voltage VREFL, and the comparator circuit 32 compares the receiving signal and the reference voltage VREFH (S17).

FIG. 18 shows a vicinity of the rising timing of the sending signal (step pulse) that is sent from the drive circuit 18b in this case. As shown in FIG. 18, the receiving signal input to the input-output terminal 30 of the memory I/F 16a rises at a certain inclination in synchronization with the rising of the step pulse, due to the influence of the direct wave from the drive circuit 18b, becomes nearly flat once due to the influence of the reflection at the memory chip 2 at the distal end, and thereafter, rises at a certain inclination again.

The comparator circuit 31 outputs the comparison result IN1 showing, as an edge, the first timing after the rising of the receiving signal, by comparing the receiving signal and the reference voltage VREFL. The comparator circuit 32 outputs the comparison result IN2 showing, as an edge, the second timing after the rising of the receiving signal, by comparing the receiving signal and the reference voltage VREFH. A time difference Td2 between the edges in the comparison results IN1, IN2 corresponds to the period during which the inclination of the receiving signal is nearly flat, namely, the intermediate distortion period due to the reflection at the memory chip 4 at the distal end via the wire 5.

As shown in FIG. 16, the TDC 33 evaluates the time difference Td2 between the timing of the rising edge in the comparison result IN1 and the timing of the rising edge in the comparison result IN2, by counting the delay time while sequentially delaying the input clock CLK (S18) The TDC 33 outputs and stores the digital value of the evaluated time difference Td2, in the memory 29.

In S19 that is a next step, the control circuit 28 evaluates the time difference Td that is the intermediate distortion period, by performing a calculation of Td=Td2−Td1, and stores the time difference Td in the memory 29 as the information about the intermediate distortion period evaluated for the memory chip 4 at the close end. In S20 that is a next step, the control circuit 28 evaluates the intermediate distortion periods for the other respective memory chips 4, using the information about the intermediate distortion period Td evaluated for the memory chip 4 at the close end, and stores the information about the intermediate distortion periods in the memory 29 (S21). When the information about the intermediate distortion periods for all memory chips 4 is evaluated and is stored in the memory 29, the process ends.

The time difference Td (intermediate distortion period) evaluated in S19 is due to the influence of the reflection from the memory chip 4 at the close end to the memory chip 4 at the distal end. For example, when a mutual interval among the four memory chips 4A to 4D is equal, the intermediate distortion period for each memory chip 4 can be evaluated by equally dividing the time difference Td into quarters. In other words, the intermediate distortion period for the memory chip 4A is Td, the intermediate distortion period for the memory chip 4B is 3/4Td, the intermediate distortion period for the memory chip 4C is 2/4Td, and the intermediate distortion period for the memory chip 4D is 1/4Td.

The operation to send the sending data from the memory I/F 16a after the completion of the process is the same as the operation in the first embodiment.

Note that a processing order of the processes of S11 to S14 and the processes of S15 to S18 may be reversed in FIG. 16.

In this way, in the present embodiment, the redundant wire that is not connected to the memory chips is provided, and the sending signal is sent from the memory controller. Then, the intermediate distortion period due to the influence of the reflected wave when the sending signal is sent through the redundant wire and the intermediate distortion period due to the influence of the reflected wave when the sending signal is sent through the ordinary wire connected to the memory chip are evaluated, and based on the difference between the intermediate distortion periods, the intermediate distortion period due to the reflection from the memory chip at the close end to the memory chip at the distal end is evaluated. Then, the intermediate distortion periods for the respective memory chips are evaluated. Thereby, it is not necessary to evaluate the information about the intermediate distortion period at the time of factory shipment, and even when aged deterioration or the like occurs in an actual line or the like, it is possible to properly measure the intermediate distortion period.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
one or more memory chips; and
a controller connected to the one or more memory chips, the controller including:
a first driver configured to send a sending signal to the one or more memory chips;
a second driver configured to generate a boost signal that is added to the sending signal; and
a control circuit configured to set an addition period for the boost signal based on information relevant to a characteristic of distortion that occurs in the sending signal to the one or more memory chips.

2. The memory system according to claim 1, wherein:
the characteristic of the distortion differs for each memory chip that is a destination of the sending signal; and
the control circuit is configured to set the addition period for each memory chip that is the destination of the sending signal.

3. The memory system according to claim 1, further comprising:
a memory configured to store the information relevant to the characteristic of the distortion; wherein
the control circuit is configured to set the addition period based on the information read from the memory.

4. The memory system according to claim 1, wherein the information relevant to the characteristic of the distortion is information indicating a partial period during which the distortion occurs in a waveform of the sending signal.

5. The memory system according to claim 1, wherein the control circuit is configured to set the addition period for the boost signal based on the information relevant to the characteristic of the distortion, at time of a rising of the sending signal and at time of a falling of the sending signal.

6. The memory system according to claim 1, wherein the boost signal causes a level of the sending signal at time of rising of the sending signal to be higher, and causes a level of the sending signal at time of falling of the sending signal to be lower.

7. The memory system according to claim 1, wherein the controller is configured to receive a signal sent from each of the memory chips, and to determine a partial period during which the distortion occurs.

8. The memory system according to claim 1, wherein the controller is configured to determine a partial period during which the distortion occurs, using a reflected wave that is obtained when a sending signal to the memory chips is reflected by the memory chips.

9. The memory system according to claim 1, further comprising:
a comparator circuit connected to a transmission path through which a signal is transmitted from or to the memory chips, and configured to receive a signal influenced by reflection at the transmission path and a signal not influenced by the reflection, and to determine a partial period during which the distortion occurs in a waveform of the sending signal, by comparison between levels of the received signals and a reference level; and
a period detection circuit configured to evaluate the partial period based on an output of the comparator circuit.

10. The memory system according to claim 9, further comprising
a redundant wire provided in parallel to the transmission path without being electrically connected to the memory chips, the redundant wire being a wire through which the sending signal from the first driver is transmitted to a vicinity of the memory chips, wherein the comparator circuit is configured to determine the partial period by receiving the sending signal from the first driver transmitted through the transmission path and receiving the sending signal from the first driver transmitted through the redundant wire.

11. An adjustment method for a sending signal to which a boost signal is added sent to one or more memory chips, the adjustment method comprising:
    acquiring information relevant to a characteristic of distortion that occurs in the sending signal to the one or more memory chips; and
    setting an addition period during which the boost signal is added, based on the information relevant to the characteristic of the distortion, for a memory chip that is a destination of the sending signal.

12. The adjustment method according to claim 11, wherein:
    the characteristic of the distortion differs for each memory chip that is the destination of the sending signal; the method further comprising:
    setting the addition period for each memory chip that is the destination of the sending signal.

13. The adjustment method according to claim 11, wherein
    the information relevant to the characteristic of the distortion is information indicating a partial period during which the distortion occurs in a waveform of the sending signal.

14. The adjustment method according to claim 11, further comprising:
    setting the addition period for the boost signal based on the information relevant to the characteristic of the distortion, at time of a rising of the sending signal and at time of a falling of the sending signal.

15. The adjustment method according to claim 11, wherein
    the boost signal causes a level of the sending signal at time of rising of the sending signal to be higher, and causes a level of the sending signal at time of falling of the sending signal to be lower.

16. The adjustment method according to claim 11, further comprising:
    receiving a signal sent from each of the memory chips, and determining a partial period during which the distortion occurs.

17. The adjustment method according to claim 11, further comprising:
    determining a partial period during which the distortion occurs, using a reflected wave that is obtained when a sending signal to the memory chips is reflected by the memory chips.

18. The adjustment method according to claim 11, further comprising:
    receiving a signal influenced by reflection at a transmission path and a signal not influenced by the reflection, the transmission path being a path through which a signal is transmitted from or to the memory chips,
    determining a partial period during which the distortion occurs in a waveform of the sending signal by comparison between levels of the received signals and a reference level; and
    evaluating the partial period based on a result of the determination.

19. The adjustment method according to claim 18, further comprising:
    determining the partial period, by receiving the sending signal transmitted through the transmission path and receiving the sending signal transmitted through a redundant wire, the redundant wire being provided in parallel to the transmission path without being electrically connected to the memory chips, the redundant wire being a wire through which the sending signal is transmitted to a vicinity of the memory chips.

* * * * *